United States Patent [19]

Worth et al.

[11] 4,333,069

[45] Jun. 1, 1982

[54] ELECTRICAL RESISTOR FOR A PRINTED CIRCUIT BOARD AND METHOD OF MAKING THE SAME

[75] Inventors: Joseph P. Worth, West Jefferson; Bert B. Fletcher, Boone, both of N.C.

[73] Assignee: TRW, Inc., Cleveland, Ohio

[21] Appl. No.: 206,703

[22] Filed: Nov. 14, 1980

[51] Int. Cl.³ .............................................. H01C 1/01
[52] U.S. Cl. .................................. 338/315; 29/610 R; 29/6.3; 338/270; 338/275; 338/322; 338/332
[58] Field of Search ............... 338/267, 268, 269, 270, 338/272, 275, 276, 296, 282, 226, 312, 315, 316–317, 261, 264, 265, 302, 322–325, 329, 332; 29/610, 613, 619, 621, 33 M, 876, 882; 361/404, 405, 408; 219/541, 542; 339/220, 31

[56] References Cited

U.S. PATENT DOCUMENTS

| | | | |
|---|---|---|---|
| 1,473,866 | 11/1923 | Phelps | 338/276 X |
| 1,971,809 | 8/1934 | Bjorndal | 338/302 X |
| 2,019,457 | 10/1935 | Lodge | 338/296 X |
| 2,023,517 | 12/1935 | Creager | 338/319 |
| 2,130,148 | 9/1938 | Muter | 338/276 X |
| 2,538,977 | 1/1951 | Mucher | 338/270 X |
| 2,879,363 | 3/1959 | Mucher | 338/268 X |
| 3,617,976 | 12/1971 | Campbell | 338/133 |
| 4,121,189 | 10/1978 | Kuhl et al. | 338/332 X |

FOREIGN PATENT DOCUMENTS

| | | | |
|---|---|---|---|
| 698655 | 11/1964 | Canada | 338/302 |
| 1490311 | 12/1968 | Fed. Rep. of Germany | 338/302 |

Primary Examiner—C. L. Albritton
Attorney, Agent, or Firm—Jacob Trachtman

[57] ABSTRACT

An electrical resistor comprising an elongated resistor body having a resistance wire winding extending between its ends and terminals at each end contact the resistance winding and each comprise a strip of given width having a first end portion extending about and secured with an end of the body, and a second end portion which extends in a direction transverse to the axis of the body and has a tip for being received through an opening in a printed circuit board. Each strip has an intermediate neck portion of reduced width which is positioned proximate to the resistor body and is twisted so that the second portion extends in a plane which is perpendicular to the axis of the body and in the same direction with and spaced from that of the other terminal allowing adjustment of the distance between their tips. The second end portions each have a shoulder proximate to its tip which is seated on the surface of a circuit board, fixing the position of the resistor and stabilizing its mounting thereon.

The method of making an electrical resistor comprises the steps of segmenting a continuous wire wound core to provide resistor bodies, and cutting out portions of a continuous substantially plane strip of metal material at spaced locations therealong to provide narrow neck regions, and first and second end portions above and below each neck region.

14 Claims, 7 Drawing Figures

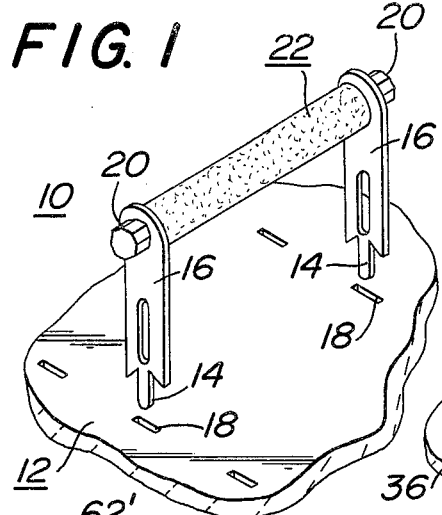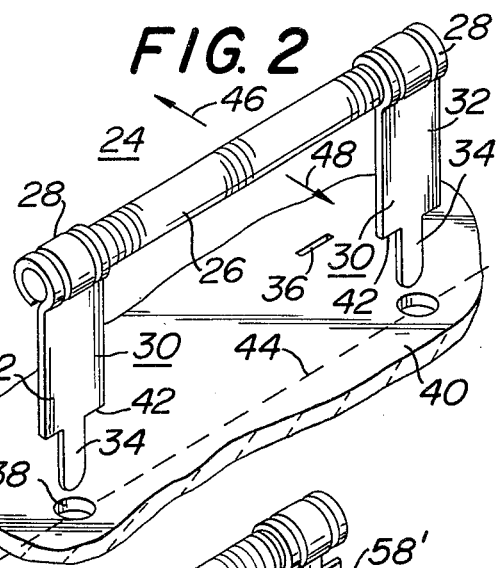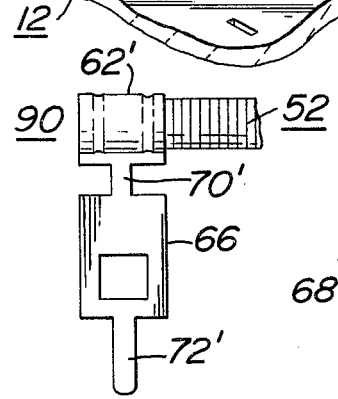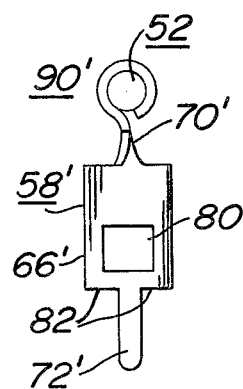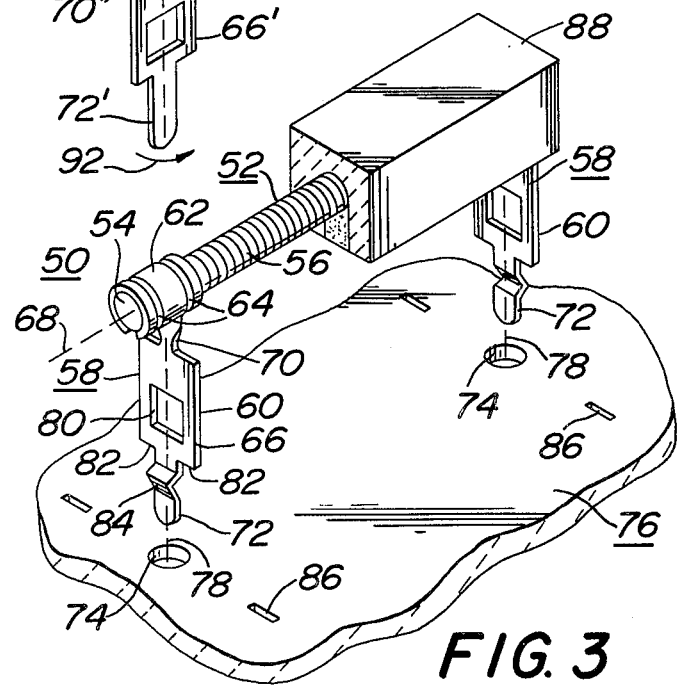

ELECTRICAL RESISTOR FOR A PRINTED CIRCUIT BOARD AND METHOD OF MAKING THE SAME

The invention relates to an electrical resistor and method of making same, and more particularly to an electrical resistor of the wire wound type for use on printed circuit boards and method of making same by a continuous and fully automatic assembly process.

BACKGROUND OF THE INVENTION

Heretofore, electrical resistors have been made having an elongated core carrying an electrical resistance path joined to electrical terminal adapted for being received on and secured to a printed circuit board. The terminals of such resistors were made with cup shaped portions for attachment to a ceramic core or phenolic tube carrying an electrical resistor material. The cup shaped portions were pressed onto the ends of the ceramic core or received over the ends of the phenolic tube and cemented thereto. In another form, where the core was provided with a resistance winding, the terminals were drawn to each have an enlarged cup shaped portion, and the ends of the wire wound resistor core were respectively received in a cup shaped portion which was crimped thereon. These constructions are difficult, if not impossible, to adapat to fully automatic assembly for obtaining an acceptable production rate.

Prior art resistors of the wire wound type have utilized a metal strip having one end portion wrapped around and compressed on the end of a wire wound core and another end portion extending therefrom to provide the terminal. The extending end portions of the pair of terminals were coplanar and did not allow adjustment of the distance between their ends. This form of resistor requires high precision construction to maintain the distance between the terminal ends at very close tolerances. Such resistors when mounted by having their ends received through openings in a printed circuit board were seated to contact the board along a single line parallel to the longitudinal axis of the resistor and were also lateral unstable.

SUMMARY OF THE INVENTION

It is therefore a principal object of the invention to provide a new and improved electrical resistor for use on a printed circuit board.

Another object of the invention is to provide a new and improved electrical resistor for use on a printed circuit board having terminals which have the distance between ends easily adjusted for being received through a pair of spaced openings in a printed circuit board.

Another object of the invention is to provide a new and improved electrical resistor for use on a printed circuit board which may have its terminals received through spaced openings in a printed circuit board and stably positioned and seated thereon prior to being permanently secured thereon.

Another object of the invention is to provide a new and improved electrical resistor for use on a printed circuit board which is inexpensive to manufacture and may have the distance between the ends of its terminals easily adjusted for being received through a pair of spaced openings in a printed circuit board and can be stably mounted and retained thereon prior to being permanently secured thereon.

Another object of the invention is to provide a new and improved electrical resistor of the wire wound type for use on a printed circuit board which may be efficiently and inexpensively manufactured even with variations in diameter of the wire wound core while providing terminals for being received through openings in a printed circuit board and retaining and positioning same in a stable position thereon prior to being permanently secured thereon.

Another object of the invention is to provide a new and improved method for making an electrical resistor for use on a printed circuit board by a fully automatic assembly process.

Another object of the invention is to provide a new and improved method for making an electrical resistor for use on a printed circuit board utilizing a continuous strip of material for forming the terminals thereof.

Another object of the invention is to provide a new and improved method of making an electrical resistor for use on a printed circuit board utilizing a continuous wire wound core, and metal strip material which is formed and severed during the method for continuously producing discrete electrical resistors having desirable mounting properties.

Another object of the invention is to provide a new and improved wire wound electrical resistor and method of making same which is highly reliable and can be efficiently and inexpensively manufactured by a fully automatic assembly process.

The above as well as many other objects and advantages of the invention are achieved by providing an electrical resistor comprising a body in the form of a rod extending along a longitudinal axis and having a resistive electrical path therealong. Terminating means which include a pair of metal terminal elements contact the elongated body at spaced locations along its resistive path. The metal elements each comprise a strip of given width having a first end portion extending about and secured with the elongated body of the resistor, and a second end portion. The second end portion extends in a direction transverse to the axis of the body and has a tip which is narrowed for being received through an opening in a printed circuit board. Each strip has an intermediate neck portion of reduced width which is positioned proximate to the body and is twisted so that the extending second portion is in a plane which is perpendicular to the axis of the body.

The resistance path along the surface of the rod may be a resistance wire winding extending from one end of the rod to the other. The metal terminal elements both extend from the body in the same direction and have their second end portions spaced from each other and positioned in respective parallel planes. The second end portions of the terminal element strips each have a shoulder proximate to its tip. When the tips are received through respective openings in the circuit board, the shoulders engage and are seated on the surface of the circuit board, fixing the position of the resistor and stabilizing its mounting thereon.

The second end portions of the strips each may also be provided with an opening for decreasing its weight and increasing its flexibility for allowing adjustment of the spacing between the tips for conforming same to the spacing of respective openings in the printed circuit board. The tips of the strips may have an axially displaced portion so that when the tips are received through round or enlarged holes in the circuit board, they will snap in and lock on the printed circuit board, thus retaining them for being secured by soldering. The resistor body and the first end portions of the metal terminal element of the resistor is desirably enclosed in a casing, which preferably is a molded insulating material, so that the second end portions of the terminal elements extend therefrom in spaced parallel relationship.

The method of making a electrical resistor for use on a printed circuit board of a type having an enlongated resistor body with a resistive path extending therealong which utilizes a continuous substantially plane strip of metal material to provide terminations for the electrical resistor, comprises the step for cutting out portions of a continuous substantially plane strip of metal material at spaced locations therealong to provide narrow neck regions and first and second end portions above and below each neck region. The first end portion of the strip is bent and conformed about the elongated resistive body to make contact with its resistive electrical path at a location along the body, while the neck portion of the strip is positioned proximate to the body. This operation is insensitive to variations in the diameter which may be present at the ends of the wire wound body.

A compressive force is exerted on the conformed first end portion of the strip for securing same about and with a resistor body and providing good electrical contact between the first end portion of the strip and the resistive path of the resistive body at the location. The continuous strip is severed below the neck region between the following second end and first end portions. This provides a second end portion of the secured strip which extends from the neck region along an axis perpendicular to the axis of the body. The second end portion of the secured strip is rotated about its longitudinal axis to twist the neck region and position the second end portion in a plane which is substantially perpendicular to the axis of the body to provide a termination for the electrical resistor.

The resistor bodies may be provided by segmenting a continuous wire wound core to provide resistor bodies with first and second ends linearly arranged with the first end of one body proximate to the second end of the adjacent body. The terminals are applied to each end of the resistor body, and the resistor body and the first end portions of the terminations are encased in molded insulating material so that the second end portions extend therefrom in spaced parallel relationship.

BRIEF DESCRIPTION OF THE DRAWING

The foregoing and other objects of the invention will become more apparent as the following detailed description of the invention is read in conjunction with the drawing, in which:

FIG. 1 is a perspective view of a prior art wire wound electrical resistor utilizing terminals which have drawn cup shaped portions for being crimped on the ends of the wire wound resistor core, FIG. 2 is a perspective view of a prior art wire wound resistor with a pair of terminals having first end portions wrapped around respective ends of a resistor body and extending second end portions which are coplanar, FIG. 3 is a perspective view of a electrical resistor embodying the invention shown with a portion of the molded casing removed, FIG. 4 is a perspective view of a modified form of the resistor of FIG. 3 during the process of its manufacture, FIG. 5 is an enlarged side view of the left portion of the resistor shown in FIG. 4, FIG. 6 is an end view of FIG. 4, after the second end portions of the terminals have been rotated 90° into spaced parallel relationship.

Like reference numerals designate like parts throughout the several views.

DETAILED DESCRIPTION

Figure 7:
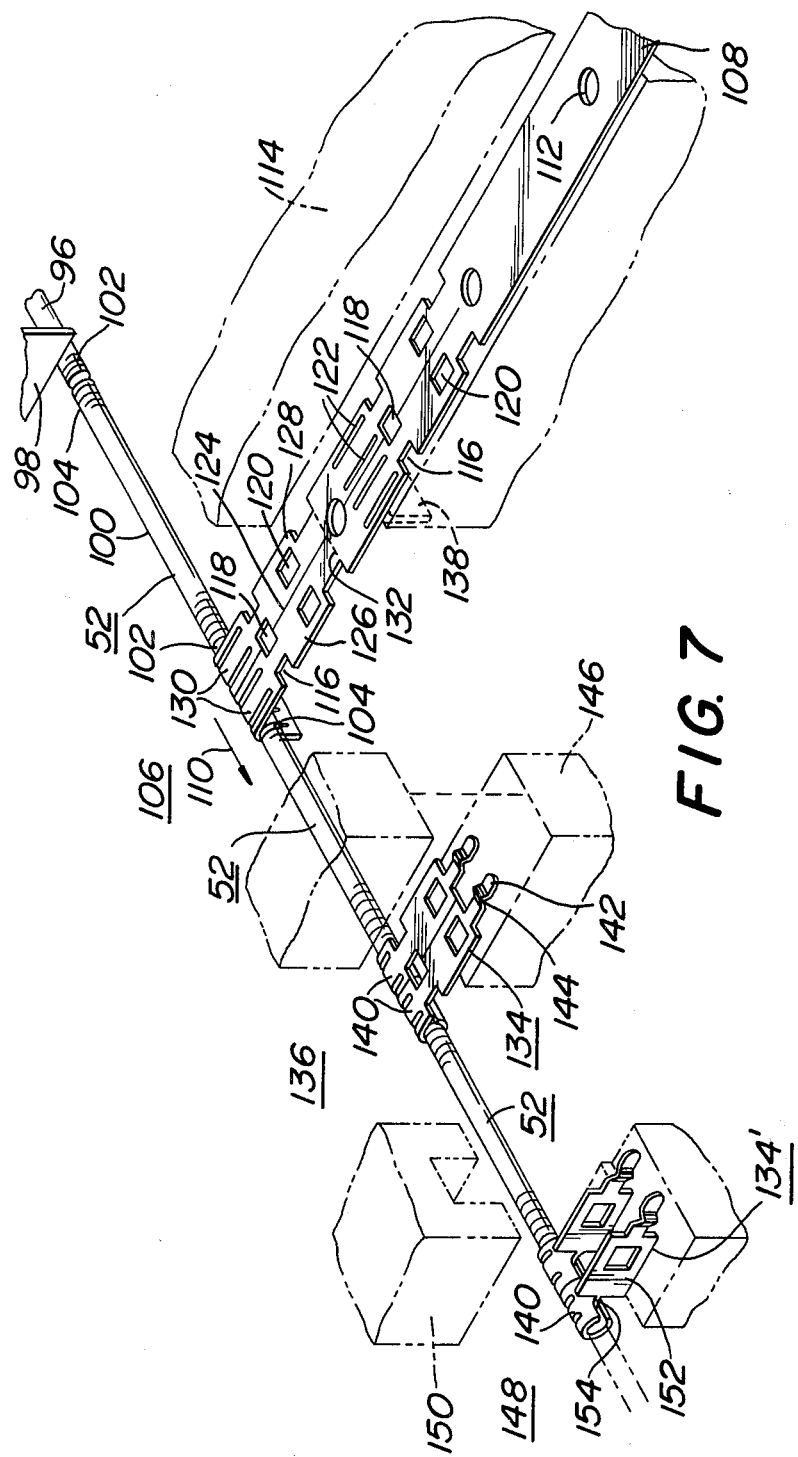
FIG. 7 is a perspective diagrammatic view illustrating the method for making a resistor embodying the invention.

FIG. 1 illustrates a wire wound resistor 10 of the prior art adapted for being mounted in a upstanding position on a printed circuit board 12 by having the narrowed ends or tips 14 of its metal terminal elements 16 received through spaced openings 18 in the terminal board 12. The metal terminal elements 16 are provided with a top portion 20 which is drawn or extruded to form a cup shaped portion. The ends of a wire wound resistor core 22 are each received in the cup shaped portion of a respective terminal 16, and the cup shaped portion is crimped on the wire wound core 22 for securing same therewith and making good electrical contact with its resistance wire. This construction which requires formation of the cup configuration for the terminal and its positioning over the resistance wire at the end of the core renders it difficult, if not impossible, to adapt to fully automatic assembly at an acceptable production rate. This is also true of the electrical resistors of the type disclosed in U.S. Pat. No. 2,023,517 entitled "Electrical Resistance Device" which has a ceramic core or phenolic tube with a resistor composition on its surface, and is provided with terminals with cup shaped portions which are pressed onto the ceramic core or cemented to the phenolic tube. This construction also is not suitable for fully automatic processing and manufacture as described herein.

FIG. 2 shows a prior art resistor 24 of the wire wound type which may be manufactured by utilizing a strip of continuous metal material and wrapping one end of the strip around an end of a wire wound resistor body 26 to provide a top portion 28 of a terminal 30. The top portion is compressed to firmly secure it with the resistor end and to provide good electrical contact with the resistor wire. The metal terminals 30, thus formed at the ends of the resistor body 26, have flat coplanar extending second portions 32 with tips 34 of reduced size for being received through narrow slots 36 or enlarged openings 38 in a printed circuit board 40. When the pair of terminals 30 have their tips 34 received through a pair of openings 36 or 38, the shoulders 42 formed in the portions 32 boarding the reduced tips 34, contact the circuit board 40 along a portion of the dashed line 44 in FIG. 2. Because of such alignment, the mounting of the resistor 24 is unstable, since it may easily be displaced laterally to one side or the other as indicated by the arrows 46, 48. This mounting of the resistor 24, is therefore, very undesirable especially when the tips 34 are received through enlarged openings 38 on the printed circuit board 40. If the resistor 24 is displaced from its desired vertical position, the soldering of its tips 34 to the circuit board 40 fixes the resistor in its off center position which may require resoldering or realignment.

In addition to this instability, the resistor 24 has an equal or even more serious defect. This is the inability of the tips 34 to have their spacing adjusted when necessary, for alignment with the pair of openings 36 or 38 through which they are to be received. This difficulty is due to the rigidity of the portions 32 of the terminals 30 to displacement in their plane along the line 44. This limitation requires that the resistors 24 be made to close tolerance, increasing their cost and limiting their utility to openings of a predetermined spacing.

FIG. 3 is a perspective view of a wire wound electrical resistor 50 embodying the invention, shown with a portion of its molded casing of insulating material removed. The electrical resistor 50 comprises a body 52 in the form of an elongated rod providing a resistor core which may be of a suitable material. The core of the body 52 is provided with a resistance path along the length between its ends 54, preferably in the form of a resistance wire winding 56 extending from one to the other of the ends 54.

The body 52 has a terminal 58 provided by a metal element made of a strip 60 of substantially constant width. The strip 60 provides a first end portion 62 of the terminal 58 which extends about and is secured with the body 52 at an end of the resistor 50. The first end portion 62 has circular ridges 64 along which it is firmly secured with the body 52 by being compressed thereabout. The end portion 62 also makes good electrical contact at its secured location with the resistance wire 56.

The metal strip 60 provides the terminal 58 with a second end portion 66 which extends in an axial direction along the dashed line 78 which is perpendicular to the longitudinal axis 68 of the body 52. The strip 60 is provided with an intermediate neck portion 70 of a reduced width which connects the first end portion 62 of the terminal 58 with its second end portion 66. The neck portion 70 is positioned proximate to the body 52 and is twisted so that the extending second end portion 66 is in a plane which is perpendicular to the axis 68 of the body 52. The second end portions 66 of the terminals 58 have tips 72 of reduced width for being received through respective ones of a pair of spaced circular or enlarged opening 74 in a printed circuit board 76.

The second end portions 66 and their tips 72 of the terminals 58 of the resistor 50 extend outwardly in the same direction along their respective longitudinal axes 78 in a direction traverse to the axis 68 of the body 52. The second end portions 66 of the pair of terminals 58 are spaced from each other in substantially parallel planes, and the tips 72 of the terminals 58 are readily displaceable towards or away from each other allowing easy adjustment of their spacing so they may be aligned with the spacing of the pair of openings 74 through which they are to be received. The second end portions 66 of the terminals 58 may also be provided with openings 80 for increasing the flexibility of the extending portions of the terminals and lightening their weight.

Shoulders 82 are formed in the second portions 66 of the terminals 58 with the narrowing of the tips 72. When the tips 72 are recieved through openings 74 in the circuit board 68, the shoulders 82 contact the circuit board 76 along portions of respective parallel lines which are in planes of their second portions 66 perpendicular to the axis 68 of the body 52. Such contacts serve to seat the terminals 58 on the printed circuit board 76 so that the resistor 50 is maintained in a vertical position and stabilized against lateral displacement of its longitudinal axis 68.

The tips 72 of the terminals 58 may also be provided with an axially displaced or undulated region 84 which can be received through enlarged openings 74 for allowing the terminals to be snapped into position to retain them in their seated positions on the circuit board 76 in advance of being soldered and permanently fixed thereon. Of course, where it is desirable for the tips 72 to be received through pairs of spaced parallel narrow slits 86, the tips 72 need not be provided with the regions 84, so that they may readily be received through the openings and properly seated on the circuit board 76.

The resistor 50 preferably is encapsulated in a suitable casing 88 enclosing the body 52 with its resistive wire, and at least the first end portions 62 and neck regions 70 of the terminals 58, while allowing the second end portions 66 to extend in spaced parallel relationship therefrom.

The resistor 50 may be efficiently manufactured by fully automated means at a high rate, and at low cost, which method will now be described in detail.

The FIGS. 4, 5 and 6 illustrate the method of making an electrical resistor 90' of the invention which is a modified form of the resistor 50. The resistor 90' differs from the resistor 50 by having the tips 72' of its terminals 58' extending directly downwardly along its axis 78' without the extending or undulated portions 84 of the terminals 58 of the resistor 50. Except for the form of its tips 72' which are adapted for being received in parallel spaced narrow slits such as the slits 86 in the board 76 of FIG. 3, the resistor 90' is identical to the resistor 50.

After the first end portions 62' of a pair of terminals 58' are secured with the respective ends of the body 52 of resistor 90 shown in FIG. 4, their second end portion 66' extend in the same direction away from the axis 68' of the body 52. The second end portions 66' are also coplanar. To produce the desired configuration each of the second end portions 66' of the pair of terminals 58' is rotated approximately 90° about its longitudinal axis 78' as illustrated by the arrow 92 in FIG. 4. This results in twisting the neck regions 70' of the pair of terminals 58', so that their extending second portions 66' are positioned in spaced parallel relationship to form the resistor 90' as shown in FIG. 6. The resistor 90' may be enclosed in a molded insulating casing such as the casing 88 of the resistor 50 to provide the final product.

FIG. 7 illustrates schematically the method for fully automatic assembly of resistors 50 in which a continuous wire wound rod 96 is fed past a cutting means 98 which severs the rod 96 into segments 100 of desired length to form the bodies 52 of the resistors to be produced. The bodies 52 have first and second ends 102 and 104 and are moved to an assembly station 106.

A continuous thin metal strip 108 of conductive material for providing terminations for the resistor 50, extends perpendicular to the direction of movement 110 of the bodies 52. The strip 108 may be provided with registration openings 112 for controlling its movement in a direction toward the bodies 52. The strip 108 is fed between die means 114 which provides notches 116 in opposite sides of the strip 108 and an intermediate opening 118 for forming the neck regions 70 of a pair of terminals 58. Openings 120 are also punched out and a plurality of parallel compression ridges 122 are formed as the strip 108 is advanced towards the bodies 52. The strip 108 is also severed along a central longitudinal line 124 to form first and second strip members 126, 128, in side by side relationship for forming in parallel, pairs of terminals 58. The ends 130 of the strip members 126 and 128, which had been bent downwardly in a previous cutting operation, are positioned over respective ends of adjacent bodies 52. The end 130 of the strip member 126 is positioned over the second end 104 of a body 52, while the end 130 of the strip 128 is positioned over the end 102 of the body 52 which is adjacent to the end 104 of the preceeding body.

The ends 130 are then completely bent about and conformed with their respective ends of the bodies 52. This operation is insensitive to variations which may be present in the diameters of the wire wound bodies at their ends. With the conforming operation, the strip members 126 and 128 are also severed along the dashed line 132 and trimmed to provide the configuration of the partially formed terminals 134 shown at the next station 136. When the terminals 134 are severed, the leading portions of the members 126, 128 of the cut strip 108 are bent downwardly as shown by the dashed lines at 138. The adjacent bodies 152 with their partially formed terminals 134 are moved in a direction 110 to the station 136, while the bent portions at the strip members 126 and 128 of the strip 108 are advanced towards and placed over the next pair of proximate ends 104, 102 of adjacent bodies 52 moved to the station 106 for the continuing forming process. At station 136 the terminals 134 are further processed by having a high compressive force exerted by die mean 146 on their first end portions 140 for firmly securing them about the ends of their bodies 52, while the tips 142 may be further formed and processed to provide the axially displaced portion 144, if desired.

At the next station 148 which receives the terminals 134, forming means 150 rotates the extending second end portions 152 of the partially formed terminals 134 about the neck region 154 previously formed by the openings 116 and 118. The extending portions 152 are placed in parallel planes and in spaced relationship and extend perpendicular to longitudinal axis of its body 52 to provide the finally formed terminals 134' which are equivalent to the terminals 58 shown in FIG. 3 for the resistor 50. The resistors are then preferably encapsulated in an insulating body which may be of a suitable molding composition to form the resistor 50 of FIG. 3, or alternatively the resistor 90' of FIG. 6.

It will, of course, be understood that the description and drawings, herein contained, are illustrative merely, and that various modifications and changes may be made in the structures and method disclosed without departing from the spirit of the invention.

What is claimed is:

1. An electrical resistor for a printed circuit board comprising a body extending along a longitudinal axis and providing a resistive electrical path therealong, and terminating means including a pair of metal terminal elements each contacting the elongated body at spaced locations along its resistive path, the metal terminal elements each comprising a strip of given width having a first end portion extending substantially about for being secured with the elongated body at a spaced location therealong and a second end portion, the second end portion extending in a direction transverse to the axis of the body and having a tip for being receiving through an opening in a printed circuit board, each strip having an intermediate neck portion of reduced width with respect to the given width of the strips which is positioned proximate to the body and twisted so that the extending second end portion is in a plane which is perpendicular to the axis of the body.

2. The resistor of claim 1 in which the body is an elongated rod with the resistance path along its surface, and the metal terminal elements extend from the body in the same direction and have their second end portions spaced from each other and positioned in respective parallel planes.

3. The resistor of claim 2 in which the intermediate neck portion of each of the strips is provided by a pair of cut out sections on opposite sides forming a region of reduced width connecting the first and second end portions.

4. The resistor of claim 3 in which the tips of the second end portions of the pair of strips are of reduced width for being received through a pair of spaced openings of a printed circuit board.

5. The resistor of claim 4 in which the second end portions of the strips have a shoulder proximate to its tip for engaging and being seated on the surface of a circuit board and fixing the position of the resistor and stabilizing its mounting on the circuit board when the tips are received through respective openings in the circuit board.

6. The resistor of claim 5 in which each of the second end portions of the strips is provided with an opening between its tip and the neck portion for increasing its flexibility and ease of adjustment of the spacing between the tips of the strips for conforming to the spacing of respective openings in the printed circuit board which are to receive the tips, and the tips of the strips each having an axially displaced portion for being received through respective openings in the circuit board to retain the resistor in position on the circuit board.

7. The resistor of claim 6 in which the elongated rod has first and second opposite ends, the electrical resistance path of the body is provided by a resistance wire spirally wound along the rod between its first and second ends, and each end of the rod has a respective one of the pair of the metal elements secured therewith and in electrical contact with the resistance wire thereat, and includes casing means which encloses the resistor so that the second end portions of the elements extend therefrom in spaced parallel relationship.

8. A method of making an electrical resistor for a printed circuit board having a resistor body extending along a longitudinal axis and providing a resistive electrical path therealong, and utilizing a continuous substantially plane strip of metal material for providing a termination, comprising the steps of (a) cutting a continuous substantially plane strip of metal material at spaced locations therealong to provide narrowed neck regions and first and second end portions above and below each neck region, (b) bending and conforming a first end portion of the strip about an elongated resistor body which has a resistive electrical path along its longitudinal axis, so that the first end portion makes electrical contact with the resistive electrical path at a location along the body, and the neck region of the strip is positioned proximate to the body, (c) exerting a compressive force on the conformed first end portion of the strip for securing same about and with the resistor body and providing good electrical contact between the first end portion of the strip and the resistive path of the resistor body at the location, (d) severing the continuous strip below the neck region between the following second and first end portions to provide a second end portion which extends from the neck region along an axis perpendicular to the axis of body, and (e) rotating the second end portion of the secured strip about its longitudinal axis to twist the neck region and position the second end portion in a plane which is substantially perpendicular to the axis of the body to provide a termination for the electrical resistor.

9. The method of claim 8 which includes the step of cutting the second end portion of the strip to provide the termination with a narrowed tip and a transversely extending shoulder.

10. The method of claim 9 which includes the steps of
(f) bending and conforming the first end portion at the severed end of the continuous strip about the resistor body at a location thereon which is spaced from the location in step (b) to make electrical contact thereat with the electrical path in accordance with step (b), and
(g) performing steps (c), (d), and (e) for providing another termination extending in the same direction and spaced from and parallel to the other termination.

11. The method of claim 10, in which the resistor body has first and second ends to which the terminations are applied, and includes the step of encasing the resistor body and the first end portions of the terminations in a molded insulating material so that the second end portions extend therefrom in spaced parallel relationship.

12. The method of claim 9 in which the elongated resistor body has first and second ends and a plurality of resistor bodies are linearly arranged with the first end of one body proximate to the second end of the adjacent body, the strip of metal material is also cut in step (a) to longitudinally sever the strip and provide a pair of coplanar side by side first and second strip members each with first and second end portions and intermediate neck regions, the first and second strip members have their first end portions applied respectively to the first and second ends of the adjacent resistor bodies for providing terminations at the ends of the electrical resistors.

13. The method of claim 12 in which the linearly arranged resistor bodies are continuously formed by segmenting a continuous wire wound core, the terminals are applied to the bodies in step (b) at an assembly station, and the resistor bodies are longitudinally moved by the assembly station so that the resistor body which had a first terminal applied to its first end formed from the first strip member during a preceding step (b) has a second terminal applied to its second end formed by the second strip member during the following step (b).

14. The method of claim 13 which includes the step of encasing the resistor in a molded insulating material so that the second end portions extend therefrom in spaced parallel relationship.

* * * * *